United States Patent
Govorkov et al.

(10) Patent No.: US 6,487,229 B2
(45) Date of Patent: Nov. 26, 2002

(54) BEAM DELIVERY SYSTEM FOR MOLECULAR FLUORINE ($F_2$) LASER

(75) Inventors: Sergei V. Govorkov, Boca Raton, FL (US); Klaus Wolfgang Vogler, Göttingen (DE); Frank Voss, Bad Gandersheim (DE); Rainer Pätzel, Dransfeld (DE)

(73) Assignee: Lambda Physik AG, Goettingen (DE)

( * ) Notice: Subject to any disclaimer, the term of this patent is extended or adjusted under 35 U.S.C. 154(b) by 0 days.

(21) Appl. No.: 09/965,492

(22) Filed: Sep. 26, 2001

(65) Prior Publication Data

US 2002/0034207 A1 Mar. 21, 2002

Related U.S. Application Data

(60) Division of application No. 09/594,892, filed on Jun. 14, 2000, which is a continuation-in-part of application No. 09/343,333, filed on Jun. 30, 1999, now Pat. No. 6,219,368.
(60) Provisional application No. 60/119,973, filed on Feb. 12, 1999.

(51) Int. Cl.[7] .................................................. H01S 3/22
(52) U.S. Cl. ............................ 372/57; 372/55; 372/58; 372/98; 372/60; 372/107
(58) Field of Search ............................. 372/57, 58, 55, 372/98, 60, 107

(56) References Cited

U.S. PATENT DOCUMENTS

| | | | |
|---|---|---|---|
| 4,258,334 A | 3/1981 | McCuster et al. ...... 331/94.5 G |
| 4,393,505 A | 7/1983 | Fahlen ..................... 372/57 |
| 4,616,908 A | 10/1986 | King ....................... 350/576 |
| 5,051,558 A | 9/1991 | Sukhman ............... 219/121.68 |
| 5,057,184 A | 10/1991 | Gupta et al. .............. 156/637 |
| 5,221,823 A | 6/1993 | Usui ..................... 219/121.78 |
| 5,440,578 A | 8/1995 | Sandstrom ................. 372/59 |
| 5,440,587 A | 8/1995 | Ishikawa et al. ............ 375/332 |
| 5,450,436 A | 9/1995 | Mizoguchi et al. .......... 372/59 |

(List continued on next page.)

FOREIGN PATENT DOCUMENTS

| | | | |
|---|---|---|---|
| EP | 0 790 681 A2 | 8/1997 | ......... H01S/3/134 |
| EP | 1 017 086 A1 | 7/2000 | ......... H01L/21/027 |
| JP | 408055792 A | 2/1996 | ......... H01L/21/027 |
| WO | WO 98/57213 | 12/1998 | ......... G02B/27/00 |
| WO | WO 98/59364 | 12/1998 | ......... H01L/21/027 |
| WO | WO 99/04467 | 1/1999 | ......... H01S/3/134 |
| WO | WO 99/08133 | 2/1999 | ......... G03B/27/42 |

OTHER PUBLICATIONS

J.A.R. Samson, "Technique of Vacuum Ultraviolet Spectroscopy," John Wiley & Sons, New York.

(List continued on next page.)

*Primary Examiner*—Leon Scott, Jr.
(74) *Attorney, Agent, or Firm*—Sierra Patent Group, Ltd.; Andrew V. Smith

(57) ABSTRACT

A system is provided for delivering a laser beam of wavelength less than 200 nm from a laser, such as an $F_2$ laser or ArF laser, through a sealed enclosure sealably connected to the laser, and preferably to another housing, leading ultimately to a workpiece. The enclosure is preferably evacuated and back-filled with an inert gas to adequately deplete any air, water, hydrocarbons or oxygen within the enclosure. Thereafter or alternatively, an inert gas flow is established and maintained within the enclosure during operation of the laser. The inert gas preferably has high purity, e.g., more than 99.5% and preferably more than 99.999%, wherein the inert is preferably nitrogen or a noble gas. The enclosure is preferably sealed by a window transparent to the sub-200 nm radiation for preventing contaminants generated in the enclosure from entering the housing and contaminating surfaces therein. The enclosure is preferably made of steel and/or copper, and the window is preferably made of $CaF_2$.

23 Claims, 12 Drawing Sheets

U.S. PATENT DOCUMENTS

| | | | |
|---|---|---|---|
| 5,559,584 A | 9/1996 | Miyaji et al. | 355/73 |
| 5,590,146 A | 12/1996 | von Borstel | 372/58 |
| 5,590,149 A | 12/1996 | Von Borstel | 372/59 |
| 5,593,606 A | 1/1997 | Owen et al. | 219/121.71 |
| 5,761,236 A | 6/1998 | Kleinschmidt et al. | 372/100 |
| 5,763,855 A | 6/1998 | Shioji | 219/121.84 |
| 5,811,753 A | 9/1998 | Weick et al. | 219/121.78 |
| 5,841,099 A | 11/1998 | Owen et al. | 219/121.69 |
| 6,219,368 B1 | 4/2001 | Govorkov | 372/59 |
| 6,243,405 B1 * | 6/2001 | Borneis et al. | 372/57 |
| 6,288,769 B1 | 9/2001 | Akagawa et al. | 355/30 |
| 6,298,080 B1 * | 10/2001 | Heist et al. | 372/57 |
| 6,345,065 B1 * | 2/2002 | Kleinschmidt et al. | 372/57 |

OTHER PUBLICATIONS

Ishchenko, et al., "High–power Efficient Vacuum Ultraviolet F2 Laser Excited by an Electric Discharge," *Sov. J. Quantum Electron,* 16 (5) May 1986, pp. 707–709.

H. Schmalenstroth, et al., "Untersuchungen zum Laserstrahlschweissen mit 1–kw–Nd:YAG–Laser unter Einsatz verschiedener Schutzgasgemische," *Schweissen & Schneiden,* 49 (1997) Heft 7, pp. 420–424.

T. McKee, "Spectral–narrowing Techniques For Excimer Laser Oscillators," *CAN. J. Phys.*, vol. 63, 1985, pp. 214–219.

S.M. Hooker, et al., "Influence of Cavity Configuration on the Pulse Energy of a High–Pressure Molecular Fluorine Laser," *Applied Physics B Photo–physics and Laser Chemistry*, vol. B55, No. 1, Jul. 1992, 8 pages.

T. Y. Chang, "Improved Uniform–Field Electrode Profiles for TEA Laser and High–Voltage Applications," *The Review of Scientific Instruments*, vol. 44, No. 4, Apr. 1973, pp. 405–407.

*Applied Physics Letters*, vol. 31, No. 1, Jul. 1, 1977, "vuv emissions from mixtures of $F_2$ and the noble gasses—A molecular $F_2$ laser at 1575 Å$^{a)}$," James K. Rice, A. Kay Hays, and Joseph R. Woodwsorth 5 pgs.

*The Journal of Chemical Physics*, vol. 69, Sep. 15, 1978, "An efficient, high power $F_2$ laser near 157 mm$^{a)}$," Joseph R. Woodworth and James K. Rice, pp. 2500–2504.

*Optics Communications*, vol. 28, No. 1, Jan. 1979, "Discharge pumped $F_2$ Laser at 1580 Å", H. Pummer, K. Hohla, M. Diegelmann and J.P. Reilly, pp. 104–106.

*Journal of Applied Physics*, vol. 50, Jun. 1979, No. 6, "Novel neutral atomic fluorine laser lines in a high–pressure mixture $F_2$ and He," Shin Sumida, Minoru Obara, and Tomoo Fujioks, pp. 3384–3887.

*Optics and Laser Technology*, vol. 11, No. 6, Dec. 1979, "CIF and $F_2$: two new ultra–violet laser systems," K. Hohla, M. Diegelmann, H. Pummer, K.L. Kompa, pp. 305–310.

*Applied Optics VUV VI*, vol. 19, No. 23, Dec. 1, 1980, "Vacuum ultraviolet excimer lasers," M.H.R. Hutchinson, pp. 3883–3888.

James K. Rice, et al., "Oscillator Performance and Energy Extraction from a KrF Laser Pumped by a High–Intensity Relativistic Electron Beam," *IEEEE Journal of Quantum Electronics*, vol. QE–16, No. 12, Dec. 1980.

E. A. Stappaerts, "Novel Analytical Design for Discharge Laser Electrode Profiles," *Appl. Phys. Lett.*, vol. 40, No. 12, Jun. 15, 1982, pp. 1018–1019.

*Journal of Applied Physics*, vol. 53, May 1982, No. 5, "Gain and saturation of the atomic fluorine laser," R. Sadighi-Bonabi, F.W. Lee, and C.B. Collins, pp. 3418–3423.

G. J. Ernst, "Compact Uniform Field Electrode Profiles," *Optics Communications*, vol. 47, No. 1, Aug. 1, 1983, pp. 47–51.

G. J. Ernst, "Uniform–Field Electrodes with Minimum Width," *Optics Communications*, vol. 49, No. 4, Mar. 15, 1984, pp. 275–277.

*Applied Physics*, Vo. B33, No. 4, Apr. 1984, "Intense Laser Generation from an Atomic–Fluorine," I.G. Koprinko, K.V. Stamenov, and K.A. Stankov, pp. 235–238.

*Review of Scientific Instruments*, vol. 56, No. 5, May 1985, "Simple, compact, high–repetition rate XeCI laser," E. Armandillo, G. Grasso, and G. Salvetti, pp. 674–676.

*Optics Communications*, vol. 55, No. 6, Oct. 15, 1985, "Gain Measurements at 157 nm in an $F_2$ Pulsed Discharge Molecular Laser," A.C. Cefalas, C. Skordoulis, M. Kompitasas and C.A. Nicolaides, pp. 423–426.

ZOS, Akademie der Wissenschaften der DDR, Zentralinstitut fur Optik und Wissenschaften der DDR, Oct. 1987, "Leistungastarker atomarer Fluorlaser im roten Spektralbereich," Jurgen Lademann, Roland Kunig, Wadim Saidow, Rainer Weidauer, 12 pgs.

S. Küper, "Ablation of Polytetrafluoroethylene (Teflon) with Femtsecond UV Excimer Laser Pulses," *Appl. Phys. Lett.*, vol. 54, No. 1, Jan. 2, 1989, pp. 4–6.

*Discharge–Pumped Excimer Laser Research in Japan*, Apr. 1988, "Theoretical simulation of a discharge pumped $F_2$ excimer laser," T. Uematsu et al. Keio U., 5 pages.

*Conference on Lasers and Electro–Optics*, 1989 Technical Digest Series, vol. 11, "Intense VUV–XUV generation from rare gas excimers," Wataru Sasaki, Kou Kurosawa, 23 pgs.

*Applied Physics Letters*, vol. 54, Feb. 13, 1989, No. 7, "High–power discharge–pumped $F_2$ molecular laser," Kawakatsu Yamada, Kenzo Miyazaki, Toshifumi Hasama, and Takuzo Sata, 6 pp.

*Leos '89, Lasers and Electro–Optics Society Annual Meeting Conference Proceedings*, Oct. 17–20, 1989, "High Power Discharge–Pumped $F_2$ Laser," K. Yamada, K. Miyazaki, T. Hasama, T. Sato, M. Kasamatsu, and Y. Mitsuhasi, 13 pgs.

*Applied Physics Letters*, vol. 56, Jun. 25, 1990, No. 26, "High specific output energy operation of a vacuum ultraviolet molecular fluorine laser excited at 66 MW/cm$^3$ by an electric discharge," Masayuki Kakehata, Etsu Hashimoto, Fumihiko Kannari and Minoru Obara, 6 pgs.

*Journal of Modern Optics*, vol. 37, No. 4, Apr. 1990, "Amplification characteristics of a discharge excited $F_2$ laser," C. Skordoulis, E. Sarantopoulou, S. Spyrou and A.C. Cefalas, pp. 501–509.

*Gas Flow and Chemical Lasers*, SPIE Vo. 1397, Sep. 10–14, 1990, "Frequency up–conversion of a discharge pumped molecular fluorine laser by stimulated Raman scattering in $H_2$," Masayuki Kakehata, Etsu Hashimoto, Fumihiko Kannari, and Minoru Obara, pp. 185–189.

*Conference on Lasers and Electro–optics*, 1990 Technical Digest Series, vol. 7, May 21–25, 1990, "Spectroscopic comparison between low and high pressure discharge pumped Xe atomic lasers," K. Komatsu, E. Matsui, S. Takahashi, Fumiko Kannari, M. Obara, 30 pgs.

Institut Fur Quantenoptik, Oct. 22, 1991, "Stimulated Raman scattering of a $F_2$–Laser in $H_2$," C. Momma, A. Tunnermann, F. Vo$_{-, c}$.Windolph and B. Wellegehausen, 8 pgs.

*Tagungsband*, Vom. 24, Bis. 26, Sep. 1991, Abstract: "Vakuum UV Molekullaser mit hoher Ausgangsleistung," 3 pgs.

*Highlights, Lambdaphysik*, No. 29, Jun. 1991, "VUV Spectroscopy by Frequency Tripling," 6 pgs.

*IEEE Journal of Quantum Electronics, Nov. 1991, vol. 27, No. 11*, "Efficiency Characterization of Vacuum Ultraviolet Molecular Fluorine ($F_2$) Laser (157 nm) Excited by an Intense Electric Discharge," Masayuki Kakehata, Tatsuya Uematsu, Fumihiko Kannari, and Minoru Obara, pp. 2456–2464.

Highlights, Lambdaphysik, No. 33, Feb. 1992, "VuV Stokes and Anti–Stokes Raman Lines Derived from an $F_2$ Laser," C. Momman, A Tunermann, F. Vo__, C. Windolph, and B. Wellegehausen, 5 pgs.

*The Journal of Physical Chemistry*, vol. 96, No. 15, Jul. 23, 1992, "Dissociation Rate Constants of Alkylbenzenes from Hot Molecules Formed by 158–nm ($F_2$ Laser) Irradiation," Tetsuya Shimada, Yuichi Ojima, Nobuaki Nakashima, Yasukazu Izawa, and Chiyoe Yamanaka, 10 pgs.

"Gas Flow and Chemical Lases," vol. 1810, Sep. 21–25, 1992, "Theoretical Anti–Stokes Conversion of VUV Spectrum by Dual–Wavelength Pumped Stimulated Raman Scattering," Tsuneo Nakata, Fumihiko Kannari, and Minoru Obara, 18 pgs.

*Chemistry Letters*, No. 7, 1992, "Photolysis of $CO_2$ with 158 nm ($F_2$ Laser. Reactivity of O ($^1$D) with $CH_4$, $CF_3H$, and $CF_3CH_3$," Masanobu Kojima, Yuichi Ojima, Nobuaki Nakashima, Yasukazu Izawa, Toru Akano, and Chiyoe Yamanaka, 10 pgs.

*The Journal of Chemical Physics*, vol. 98, No. 11, Jun. 1993, "Laser photolysis of benzene at 158 nm," Tetsuya Shimada, Nobuaki Nakashima, Yasukazu, Izawa, and Chiyoe Yamanaka, pp. 438–440.

*Applied Physics Letters*, vol. 63, No. 4, Jul. 26, 1993, "Small–signal gain measurements in an electron beam pumped $F_2$ laser," H.M.J. bastiaens, B.MN.C. van Dam, P.J.M. Peters, and W. J. Witteman, 7 pgs.

Highlights Lambdaphysik, Apr. 1993, "Excimer laser based microstructuring using mask projection techniques," U. Sarbach and H.J. Kahlert, 4 pgs.

*Highlights, Lambdaphysik*, No. 43, Jan. 1994, "Photochemical modification of Fluorocarbon Resin to Generate Adhesive Properties," 6 pgs.

*Journal of Applied Physics*, vol. 77, Jan. 1–15, 1994, "Long pulse electron beam pumped molecular $F_2$Laser," F.T.J.L. Lankhorst, H.M.J. Bastiaens, P.J.M. Peters, and W.J. Witteman, pp. 399–401.

*Applied Physics Letters*, vol. 51, No. 13, Sep. 28, 1987, "Theoretical evaluation of high–efficiency operation of discharge–pumped vacuum–ultraviolet $F_2$ lasers," Mieko and Minoru Obara, pp. 958–960.

Dupont, et al., "Enhancement of Material Using 248, 308, 532, 1064 nm Laser Pulse with a Water Film on the Surface," *J. Appl. Phys.*, 78 (3), Aug. 1, 1995, pp. 2022–2028.

V.M. Borisov, et al., "Effects Limiting the Average Power of Compact Pulse–Periodic KrF Lasers," *Quantum Electronics*, vol. 25, No. 5, May 1995, pp. 421–425.

*Journal of Applied Physics*, vol. 81, No. 6, Mar. 1997, "Small–signal gain measurements in a discharge–pumped $F_2$ laser," Tahei Kitamura, Yoshihiko Arita and Keisuke Maeda, Masayuki Takasaki, Kenshi Nakamura, Yoshiano Fujiwara and Shiro Horiguchi, 12 pgs.

"Processing of PTFE with High Power VUV Laser Radiation," D. Basting, U. Sowada, F. $Vo_{14}$, P. Oesterlin, 3 pgs.

S. Zhu, et al., "Laser Ablation of Solid Substrates in a Water–Confined Environment," *Applied Physics Letters*, vol. 79, No. 9, Aug. 27, 2001, pp. 1396–1398.

\* cited by examiner

Measurements:
- Type of purge gas: Ar, $N_2$
- Flow rate: V = 10 ... 300 l/h
- Laser power: P=0 ... 10W
- Material composition of beam line drop of the $O_2$ contamination level after opening the beam path (e.g., after maintenance) close it and start purging by dry high purity $N_2$
  e.g., purge rate flow V = 150 l/h
     overpressure (over outside air) ≤ 10 mbar exponential decrease of $O_2$ concentration in ppm time to drop for 0.9 ppm to 0.3 ppm.

BEAM DELIVERY SYSTEM FOR MOLECULAR FLUORINE (F$_2$) LASER

PRIORITY

This Application is a divisional application which claims the benefit of priority under 37 C.F.R. 1.53(b) to U.S. patent application Ser. No. 09/594,892, filed Jun. 14, 2000, which is continuation-in-part of U.S. patent application Ser. No. 09/343,333, filed Jun. 30, 1999, which claims the benefit of priority to U.S. Provisional Patent Application No. 60/119,973, filed Feb. 12, 1999, each of which is hereby incorporated by reference into the present application.

BACKGROUND OF THE INVENTION

1. Field of the Invention

The present invention relates to a beam delivery system for use with lasers, and particularly for use with discharge pumped molecular fluorine lasers emitting around 157 nm.

2. Discussion of the Related Art

Molecular fluorine (F$_2$) lasers operating at a wavelength of approximately 157 nm are a likely choice for deep UV/vacuum UV microlithography with resolution below 0.1 micrometer. Laser radiation at this wavelength is also very useful for micromachining applications involving materials normally transparent at commonly available laser wavelengths.

Efficient extracavity transport of a sub-200 nm laser beam to the target is complicated by strong absorption in the atmosphere. That is, the sub-200 nm laser beam of such a laser will propagate a certain distance along an extracavity beam path between the laser output coupler and a work piece where it is subject to absorptive losses due to any photoabsorbing species such as water, oxygen and hydrocarbons located along the beam path. For example, an extinction length (1/e) for 157 nm radiation emitted by the F$_2$-laser is less than a millimeter in ambient air.

High intracavity losses also occur for lasers operating at wavelengths below 200 nm, again due particularly to characteristic absorption by oxygen and water, but also due to scattering in gases and all optical elements. As with the absorption, the short wavelength (less than 200 nm) is responsible for high scattering losses due to the wavelength dependence of the photon scattering cross section.

These complications from absorption and scattering are much less of a problem for conventional lithography systems employing 248 nm light, such as is emitted by the KrF-excimer laser. Species such as oxygen and water in the cavity and atmosphere which absorb strongly below 200 nm, and specifically very strongly around 157 nm for the F$_2$ laser, exhibit negligible absorption at 248 nm. The extinction length in ambient air for 248 nm light is substantially more than ten meters. Also, photon scattering in gases and optical elements is reduced at 248 nm compared with that occurring at shorter wavelengths. In addition, output beam characteristics are more sensitive to temperature-induced variations effecting the production of smaller structures lithographically at short wavelengths such as 157 nm, than those for longer wavelength lithography at 248 nm. Clearly, KrF excimer lasers do not have the same level of problems since the 248 nm light scatters less and experiences less absorption.

One possible solution for dealing with the absorption problems of the 157 nm emission of the F$_2$ laser is sealing the beam path with a housing or enclosure and purging the beam path with an inert gas. However, high flow rates are typically used in this technique in order to minimize the down time needed to remove absorbing species from the beam enclosure. That is, starting from a state where the enclosure is filled with ambient air, an unacceptably long purge time and high flow rate would be required to bring the partial pressure of absorbing species down to a reasonable level. It may also be necessary to perform this purging technique with a very clean inert gas, e.g., containing less than 1 ppm of absorbing species such as water and oxygen. Commercial ultra high purity (UHP) grade gases may be obtained to satisfy these purity requirements at increased cost. Overall, this purging approach is expensive and inconvenient.

Another solution would be evacuating the beam path. In this case, a relatively low pressure vacuum would be needed resulting in an expensive pumping system. For example, ultrahigh vacuum (UHV) pumping equipment and techniques may be necessary for achieving a pressure below 100 millitorr. Such equipment and techniques combine a tight enclosure with high pumping capacity. Unsatisfactorily long initial pumping times would still be required. In this evacuation approach, transmission along the optical beam path enclosure would be determined by the absorption of radiation by "residual" gases, mainly oxygen, water vapor and hydrocarbons which remain despite the evacuation, e.g., particularly attached to the interior walls of the enclosure.

FIG. 1 shows an experimentally measured dependence of the transmission of a 0.5 meter optical path on the residual air pressure. A theoretical fit is also shown in FIG. 1 and is based on the assumption that the main absorbing species is water vapor having an absorption cross-section of approximately $3 \times 10^{-18}$ cm$^2$. This assumption is believed to be justified because water has a tendency to be adsorbed at the walls of vacuum systems and thus, to dominate the residual pressure in such systems.

As can be seen, at a residual pressure of 50 milliTorr, the optical losses amount to about 1% per each 0.5 meter of the optical path. At around 100 milliTorr, the optical losses amount to about 2% per each 0.5 meter. At 150 milliTorr and 200 milliTorr, respectively, the losses amount to 3% and 4.5%. In a system such as a microlithographic stepper, the optical beam path can be as large as several meters which would lead to an unsatisfactorily high total amount of losses at that loss rate. For example, an average five meter beam path, even at a transmittance between 99% and 95.5%, as shown for 50–200 milliTorr residual pressures in FIG. 1, corresponds to between a 10% and 37% loss.

Another consideration is the energy stability. It is desired to maintain laser energy dose variations, and/or energy moving average variations, to less than, e.g., 0.5%. If residual oxygen or water vapor partial pressures fluctuate by 0.5% to 1.0%, e.g., then fluctuations in the absorption of the beam by these species could cause the energy dose stability to fall below desired or even tolerable levels. It is recognized in the present invention that a first step of lowering the partial pressures of photoabsorbing species along the laser beam path would serve to lower the % absorption fluctuation and increase the energy dose stability, even if the % concentrations of these species fluctuate at the same % value. It is desired, then, to have a technique for preparing the beam path of a VUV laser such that absorption and absorption fluctuations of the beam along the beam path are low enough to meet energy dose stability criteria, e.g., of <0.5%.

It is clear from the above measurement and theoretical fit for the beam path evacuation technique that one needs to lower the residual pressure of the absorbing species substantially below 100 milliTorr to achieve acceptable optical losses, e.g. less than around 1% per meter of optical path length, and acceptable optical loss fluctuations. Such low pressures can only be obtained using complex and expensive vacuum equipment and/or operating the vacuum equipment for an unacceptably long time. All together, this leads to a substantial and undesirable downtime for pumping and requires complex and expensive equipment. An approach is needed for depleting the beam path of a laser operating below 200 nm, particularly an $F_2$ laser, of photoabsorbing species without incurring excessive down times or costs.

It is recognized in the present invention that photoabsorbing species may tend to accumulate in greater concentrations along a beam path of a sub-200 nm laser beam than would otherwise accumulate along a similar length, e.g., of an enclosure otherwise substantially free of photoabsorbing and/or other contaminant species. This contamination generation has been observed experimentally to occur along the beam path from the VUV laser to an imaging system, workpiece, or other external application process equipment. It is desired that such photoabsorbing and/or other contaminant species be prevented from exiting the enclosure and contaminating another environment, such as a housing connected to the enclosure which may contain an imaging system and/or workpiece.

SUMMARY OF THE INVENTION

It is therefore an object of the invention to provide a laser system wherein a beam path of the laser beam exiting the laser is substantially depleted of species which photoabsorb strongly below 200 nm including such species as air, water, oxygen and hydrocarbons.

It is a further object to provide a system wherein contaminants generated along a beam path of the laser beam exiting the laser are flushed from the beam path and/or prevented from crossing from the beam path into an external enclosure, while the beam is allowed to propagate into the external enclosure.

In accordance with the above objects, a beam delivery system for connecting to a laser emitting a laser beam at less than 200 nm and for delivering the laser beam to an external housing leading ultimately to a workpiece is provided. The system includes an enclosure sealing at least a portion of the beam path exiting the laser from the outer atmosphere. the enclosure includes a plurality of ports for flowing an inert gas, of preferably 99.5% purity or more, within the enclosure to enable the laser beam to propagate along the beam path, such that the energy of the beam can traverse enclosure without substantial attenuation due to the presence of photoabsorbing species along the beam path. A window preferably seals the enclosure that is substantially transparent at the emission wavelength of less than 200 nm to allow the beam to exit the enclosure and enter the external housing, while preventing contaminants generated within the enclosure from exiting the enclosure and contaminating surfaces within the housing.

Propagation with significant transmittance of the 157 nm emission of a molecular fluorine ($F_2$) laser along the beam path is specifically enabled in the present invention, as well as for ArF, Xe, Kr, Ar, and $H_2$ lasers operating respectively at 193 nm, 172 nm, 145 nm, 125 nm and 121 nm. Absorption and absorption fluctuations are advantageously maintained at a low level within the enclosure for greater efficiency, energy stability and energy dose stability. The sub-200 nm beam is allowed to propagate along the beam path within the enclosure, and then to exit the enclosure, preferably into a second enclosure such as may include an optical imaging system of a photolithography system, leading ultimately to a workpiece, while contaminants generated within the enclosure are prevented from exiting the enclosure due to the presence of the window sealing the enclosure.

BRIEF DESCRIPTION OF THE DRAWINGS

FIG. 12 shows plots of the dependence of oxygen concentration in the enclosure of FIG. 4b on the purge gas flow rate for argon and nitrogen purge gases with and without the laser turned on.

FIG. 14 shows plots of the dependence of generated oxygen concentration in the enclosure of FIG. 4b on the purge gas flow rate for nitrogen purge gas with the laser on.

DETAILED DESCRIPTION OF THE PREFERRED EMBODIMENT

Figure 1:
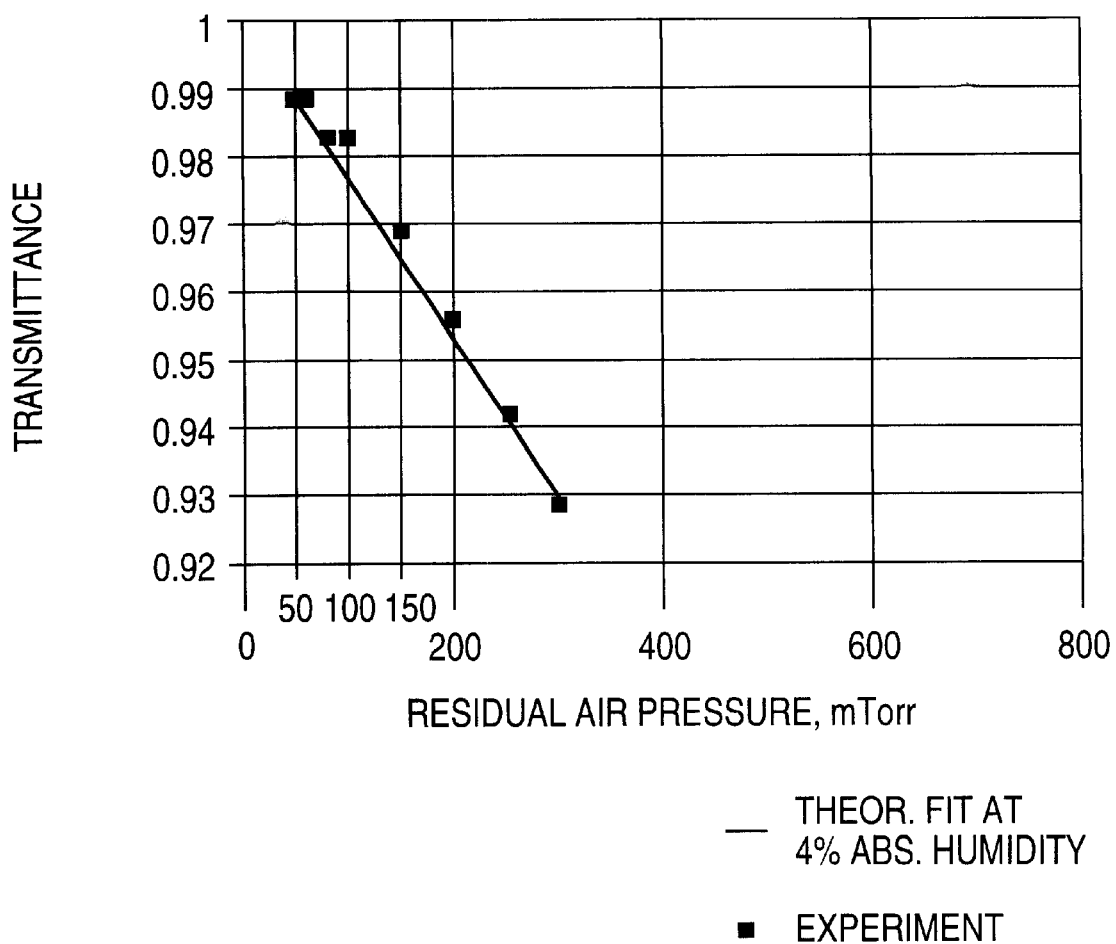
FIG. 1 shows a dependence of the transmittance of a 157 nm beam propagating along a 0.5 m evacuated beam path on the residual air pressure along the beam path.
Figure 2:
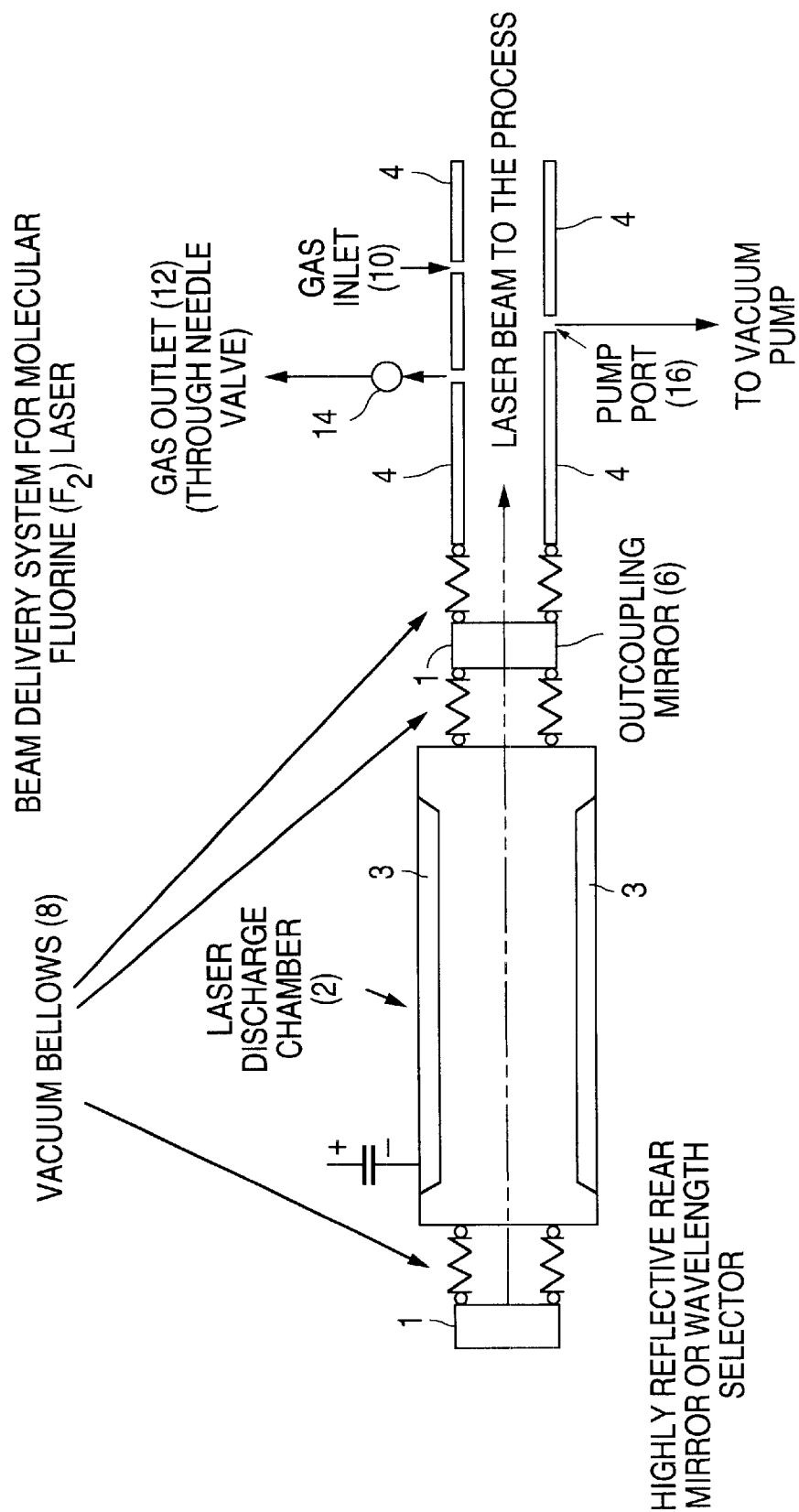
FIG. 2 shows a first embodiment of a beam delivery system for an $F_2$ laser emitting around 157 nm or another laser such as an ArF laser, emitting at less than 200 nm, including an enclosure providing an inert gas purged beam path.

FIG. 2 shows a preferred embodiment of a beam delivery system for the present invention. The present invention may be used with any laser, but is particularly advantageous for a laser operating below 200 nm such as ArF, Xe, $F_2$, Kr, Ar and $H_2$ lasers operating around 193 nm, 172 nm, 157 nm, 145 nm, 125 nm and 121 nm, respectively. An $F_2$ laser system operating around 157 nm will be specifically referred to in the preferred embodiment below. Resonator optics 1 are preferably mounted to a laser discharge chamber 2 or tube in such a manner that their tilt can be adjusted, in order to align them to the optical axis of the resonator 1. Preferred optical and electrical systems are described in greater detail in U.S. patent application Ser. Nos. 09/090,989 and 09/136,353 and U.S. Provisional Application No. 60/120,218, each of which is hereby incorporated into the present application by reference. For example, means for selecting one of the closely-spaced natural emission lines around 157 nm of the $F_2$ laser is part of the preferred optics.

A pair of main electrodes 3 is connected to an external power supply circuit to supply a pulsed discharge to excite the molecular fluorine in the gas mixture. In addition, UV-preionization of the electrical discharge is also provided and may be realized by means of an array of spark gaps or by another source of UV-radiation (surface, barrier or corona gas discharges), disposed in the vicinity of at least one of the main electrodes 3 of the main discharge of the laser. A preferred preionization unit is described in U.S. patent application Ser. No. 09/247,887 which is also hereby incorporated by reference into this present application.

A housing or enclosure 4 containing the beam path is attached to an outcoupling mirror holder 6 of the resonator optics 1 preferably through vacuum bellows 8 and sealed with conventional o-rings (such as Viton™ o-rings), flat packing or other sealing materials. This allows degrees of freedom necessary for optical alignment of the outcoupling mirror 6, while at the same time maintaining a vacuum-quality seal between the outcoupler 6 and the beam path enclosure 4. The residual pressure within the beam path enclosure 4 preferably may be reduced to less than 200 milliTorr, and specifically to 100 milliTorr or less.

The enclosure 4 is equipped with a purging gas inlet 10 and a gas outlet 12 and means for controlling the gas flow rate, such as an adjustable needle valve 14. If only one inlet 10/outlet 12 pair is used, the inlet 10 and outlet 12 are spaced apart and preferably located at opposed ends of the enclosure 4. A long beam delivery system will preferably have several pairs of gas inlets 10 and outlets 12. The inlets 10 and outlets 12 are preferably positioned to provide a homogeneous medium within the enclosure along the beam path. In this way, every section of the beam delivery system is sufficiently purged with low consumption of the purge gas. Even a short beam delivery system may have several gas inlets 10 and outlets 12 especially, e.g., if a clear aperture within the beam delivery system is blocked by built-in optical components and mounts. For example, the beam path may be partitioned with one or more optical windows.

The preferred vacuum level can be achieved by connecting a simple and inexpensive (e.g., 50 mTorr) one or two stage mechanical rotary vane or rotary piston pump or roughing pump (not shown) to the enclosure 4 via a pump port 16. The pump port 16 need not be a separate connection to the enclosure 4. For example, the vacuum source may use the inlet 10 or outlet 12 connection to the enclosure 4 which may be sealed off from the pump when the inert gas is flowing, such as by a T-valve or some similar component.

Preferably, a 0.5 mbar 4-stage diaphragm pump is used. An oil vapor trap may be used between the pump and the beam path enclosure, such as a cryogenic trap or Micromaze [™] filter. A three-stage diaphragm pump, which is relatively cheap and oil-free, can also be used. Alternatively, a more sophisticated pump or pumps may be used such as an oil diffusion pump, a cryogenic pump or a turbomolecular pump. The preferred "tightness" of the beam path enclosure 4 is equivalent to a leak rate of one Torr-liter per minute or lower. The purging gas is preferably ultra-high purity (UHP) grade helium, argon, or neon, although other inert gases (e.g., nitrogen) of UHP grade may also be used.

A preferred procedure of preparing the beam path enclosure 4 for operation of a laser system of the present invention, and particularly for the $F_2$ laser emitting at 157 nm, is explained below. Note that the preferred laser system includes a processor for controlling and coordinating various components. The procedure for preparing the beam path, in accord with the present invention, may be manually- or processor-controlled. If a processor is used, vacuum gauge and gas flow meter readings would be inputs. The processor would generate output signals for controlling the opening and closing of the pump port 16 and the purging gas inlet(s) 10 and outlet(s) 12 and the flow control of the valve 14.

The preferred method includes first, closing the gas inlet 10 and outlet 12. Second, opening the pump port 16, and pumping down the enclosure 4 with, e.g., a 50 milliTorr vacuum pump until the vacuum gauge indicates that a predetermined residual pressure has been reached within the enclosure 4, e.g., 100–200 milliTorr, or lower. In a preferred embodiment, the enclosure 4 is pumped down to around 0.5 Torr using a 3 or 4 stage diaphragm pump. Next, the pump port 16 is closed off, the inlet port 10 is opened and the enclosure 4 is filled with inert gas flowing in through the inlet port 10 until approximately atmospheric pressure or higher is reached in the enclosure 4. Then, the inlet port 10 is again closed and the pump port 16 opened to repeat the evacuation procedure. These steps of evacuating the enclosure 4 followed by back-filling the enclosure 4 with inert gas are preferably repeated several times.

After these several gas flushing cycles, the pump port 16 is closed and both the gas inlet 10 and gas outlet 12 are opened. A gas flow at a selected flow rate, preferably around 0.1 liters per minute, is established and maintained in the enclosure 4 through control of the flow control valve 14. The pressure is now maintained around atmospheric pressure or preferably slightly higher. The beam path enclosure is now ready for working operation of the laser.

Figure 3:
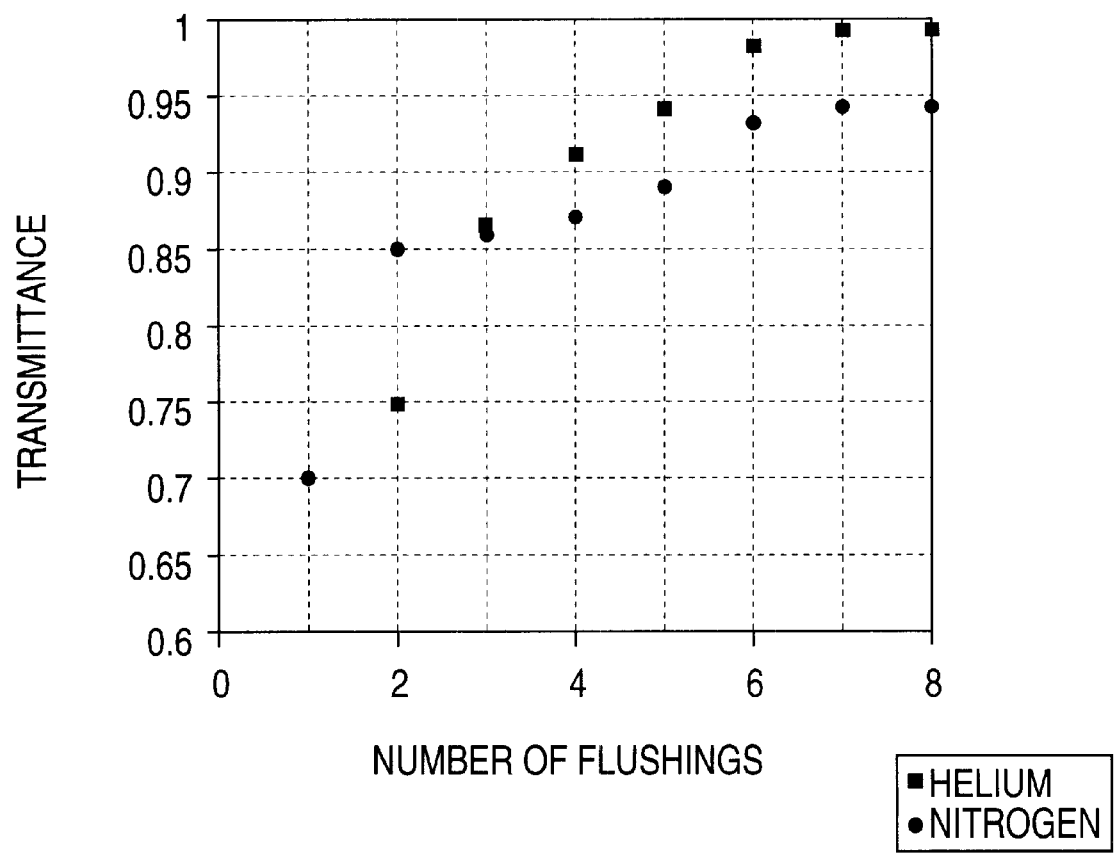
FIG. 3 shows a dependence of the transmittance of a 157 nm beam propagating along a 0.5 m beam path purged with helium or nitrogen gas on the number of flushings of the beam path using each of the two inert gases.

FIG. 3 shows that the transmittance of a 157 nm beam from an $F_2$ laser along a 0.5 meter long optical path using helium and nitrogen as flushing gases. The transmittance is shown as increasing with the number of flushes, but becomes asymptotic to its highest value in as few as eight (8) "flushing" cycles. Of course, more than eight flushing cycles may nonetheless be used. As can be seen, for helium, close to 99% transmittance can be achieved with eight flushes. The results using nitrogen were not as good as with helium. However, the nitrogen used in the experiments has a specified level of water of only 3 ppm, while UHP helium was much more pure and had a specified water level of less than 1 ppm which may have accounted for the difference in performance.

The present invention teaches that using cycles of evacuating and filling the enclosure 4 with inert gas allows drastically reduced preparation times and also minimizes inert gas consumption. After these flushing cycles are performed, a preferred flow rate of 0.1 liters per minute is sufficient to maintain high transmittance for a substantial period of time. The entire preparation cycle advantageously takes only a few minutes. In addition, relatively inexpensive pumps and lower cost sealing arrangements can be used.

In another aspect of the invention, it is recognized in the present invention that contaminants may be generated within the enclosure which may flow onto a workpiece that is being processed or exposed using the VUV laser beam that is traversing the interior of the enclosure, or onto optical equipment. The contaminant generation rate is recognized as being related to the operation of the laser, such as due to the interaction of the VUV beam or stray light therefrom with components within the enclosure or the enclosure itself. It is further recognized in the invention that these contaminants may conventionally flow out of an opening at the end of the enclosure (see FIG. 2).

Figure 4A:
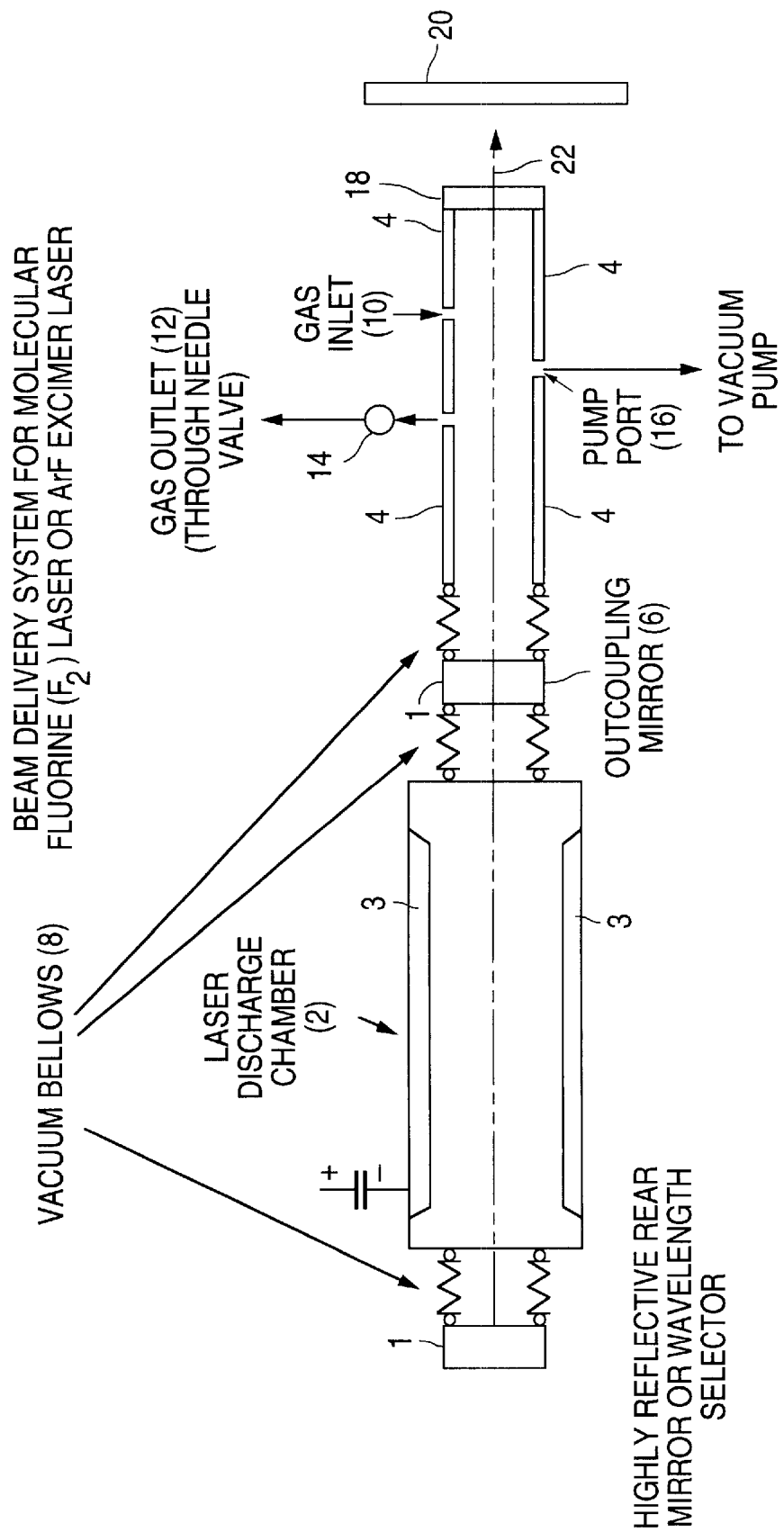
FIG. 4a shows a preferred embodiment of a beam delivery system for an $F_2$ laser emitting around 157 nm or another laser such as an ArF laser, emitting at less than 200 nm, including an enclosure sealed with a transparent window providing an inert gas purged beam path.

In accordance with the present invention, then, referring to FIG. 4a, a VUV transparent window 18 is provided to seal the interior of the enclosure 4 from a workpiece 20, or other processing or beam shaping equipment, e.g., an optical imaging system, that the VUV beam 22 may be directed towards. The window 18 is transparent to VUV light, and so the window is made of preferably $CaF_2$ and alternatively a material such as $BaF_2$, LiF, $SrF_2$, $MgF_2$, quartz and fluorine doped quartz, or another material that may be known to one skilled in the art as being substantially transparent to light around 157 nm. The window may have an antireflection coating on it, as well. Thus, the VUV beam is allowed to escape the enclosure which protects the beam from attenuation, while contaminants generated within the enclosure are unable to escape and are thereby prevented from deteriorating a workpiece 20 or other processing or optical equipment.

The concerns addressed by this aspect of the invention wherein a window is included at the end of the beam path of the molecular fluorine VUV laser system, are shown in more detail below as being verified by experimental results. The presence of the VUV beam is shown experimentally as providing an increase in the contamination level in the enclosure. For example, when a copper enclosure was used, a contamination level of $O_2$ was measured to be 0.5 ppm when the laser was off, and 0.8 ppm when the laser was on under otherwise identical conditions. A laser running continuously for two days and having a stainless steel enclosure was shown to have an $O_2$ contamination level between 0.4 and 0.5 ppm, which fell to between 0.25 and 0.3 ppm when the laser was switched off. The $O_2$ level increased back to between 0.45 and 0.55 ppm when the laser was later switched back on.

Thus, particularly when the laser is running, it is advantageous to have the window of the present invention to block impurities from exiting the enclosure and deteriorating a workpiece 20 or other processing equipment outside the enclosure 4. The workpiece 20 or other processing equipment such as optical imaging equipment, etc., may be protected by its own enclosure (not shown) which protects the workpiece 20, etc., from contaminants such as $O_2$, $H_2O$, hydrocarbons and dust in the atmosphere. This external enclosure (not shown) for the workpiece may be a clean room or a smaller housing. The external enclosure (not shown) may be sealably connected to the enclosure 4 at the window 18, whereby the window 18 seals the enclosure 4 from the enclosure (not shown). Thus, the enclosure 4 and the external enclosure (not shown) are optically and mechanically coupled together, although there is not fluid communication between the two enclosures. The window 18 advantageously prevents contaminants generated in the VUV laser enclosure 4 from entering the external enclosure (not shown) for an imaging system and/or workpiece.

The window 18 itself may be kept clean by using a method of flowing very clean gas past the window to prevent contaminated gas from accessing the window and depositing a film that might absorb VUV light and attenuate the beam. The technique set forth in U.S. Pat. No. 4,534,034 (hereby incorporated by reference), whereby an electrostatic precipitator is used to clean some portion of gas before flowing that gas to a laser tube window, may be used to keep the window 18 clean. In addition, a set of baffles and/or a precipitator may be positioned near the window 18 to trap contaminants and keep them from accessing the window 18.

It is recognized in the invention that the generated contaminants may also deteriorate the atmosphere within the enclosure such as to attenuate the VUV beam notwithstanding that the method of pumping and purging the interior of the enclosure with an inert gas as described above is in place. It is further recognized in the invention that the degree of contamination generated within the enclosure may depend on the materials that the enclosure is made of. Moreover, the particular pressure within the enclosure may effect the performance of the system. Lastly, the particular purge gas being used may enhance or reduce the performance or the benefits of the enclosure according to the above aspect of the invention. These features are not only recognized in the present invention as potentially effecting the system, but as described below, advantageous beam enclosures are provided in accordance with that recognition and in accordance with the preferred embodiment.

Experiments were performed in accordance with the features recognized as effecting the molecular fluorine laser system and beam path enclosure 4 (see above). In accordance with the present invention, a system is provided that is improved based on results produced in experiments conducted with respect to that recognition.

Figure 4B:
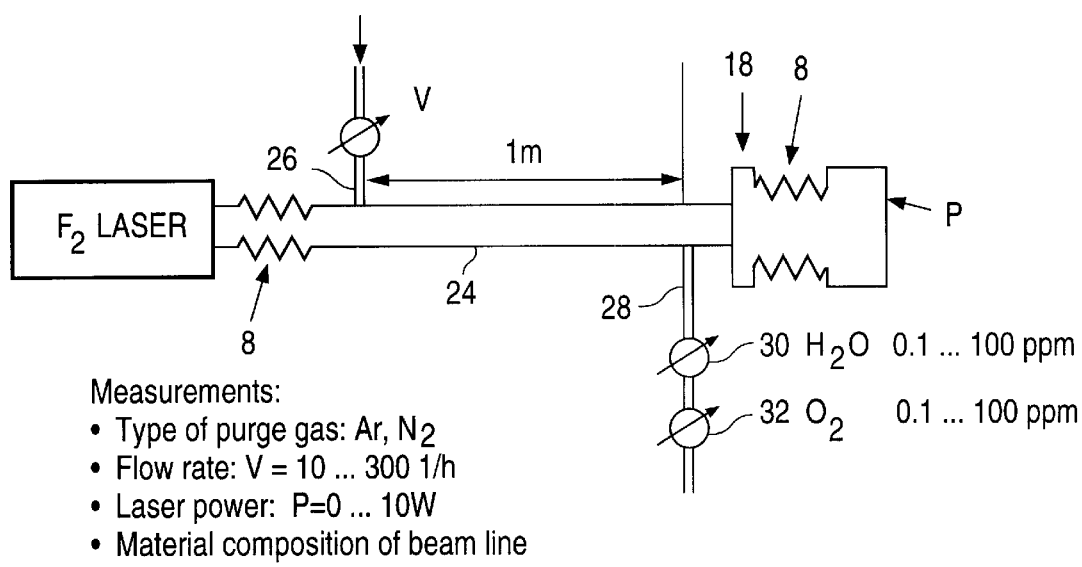
FIG. 4b shows an experimental setup, and also an alternative embodiment when the detector P is replaced by an external housing including an optical imaging system of a photolithography system and/or a workpiece.

FIG. 4b schematically illustrates the experimental setup used. FIG. 4b also illustrates alternative features to the embodiment shown at FIG. 4a, including an enclosure sealably connected to an $F_2$ laser. The enclosure 24 has an inlet port 26 and an outlet port 28 for flowing the inert gas through the enclosure, and vacuum bellows at either end of the enclosure 24 to facilitate connection to the laser and to a photodetector P. The inlet port 26 has an adjustable valve V for adjusting the flow rate of the gas purge. An additional valve may be included for connecting the enclosure 24 to an evacuation port either through the inlet or outlet ports 26, 28 or through an additional port 9 not shown). The outlet port is connected to a moisture content monitoring system 30 and an $O_2$ monitoring system 32.

The preferred system for application processing would include a window 18 as described above with respect to FIG. 4a and the photodetector would be replaced by an application process such as an imaging system and workpiece or only a workpiece, wherein the imaging system and/or workpiece would typically be in a housing sealably connected to the enclosure 24, just as the photodetector is shown in FIG. 4b to be sealably connected to the enclosure 24.

Long term exposure tests were carried out using a photodetector P including pre-production-type SXUV- and PtSi-photodiodes. In this way, the output energy of the VUV beam could be accurately measured so that effect on that energy by changing materials, such as of the enclosure itself or of the purging gas supply, and other parameters, such as the pressure, of the interior of the enclosure could be noted. In addition to monitoring the output energy of the VUV beam, the experiments were also carried out with a separate, continuous monitoring of the $O_2$ and water vapor content within the purged exposure box 24 using the $H_2O$ monitor 30 and $O_2$ monitor 32. Purge gases used were argon and nitrogen. The flow rate was varied between 10–300 l/h. The laser power was varied between 0–10 W. In addition, the material composition of the enclosure 24 was varied (copper, stainless steel and PTFE hoses were used).

Some preferred equipment for carrying out the experiments on the increase or decrease of $O_2$ and $H_2O$-vapor density in the enclosure 24 under predetermined conditions are included below:

$O_2$ detection system (32): model DF153-100 from Delta F corp.

Moisture Analyzer (30): model 1C-C1 DewTrace from Edge Tech

Both analyzing systems 30 and 32 are identical to those used at MIT Lincoln Lab and operate well in a detection range of 0.1 ppm to 100 ppm for each of the contaminants measured.

Experimental set up: The exposure box 24 was purged with a flow rate of V=90 liters/hour, against open air with an estimated overpressure of <50 mbar. This range between zero and 50 mbar overpressure was recognized in the present invention, and verified in the experiments as being the range of pressures that provide optimal results. Three additional energy monitors and six energy detectors are illuminated in a long term run at 1 kHz. The beam fluence on the optics was F=10 mJ/cm$^2$, and on the detectors 10 $\mu$J/cm$^2$ or 10 $\mu$J/cm$^2$ depending on specific position of the optics and the detectors. The laser was operated in Energy=constant mode, whereby power was checked by the multiple energy monitors (reading) and by a LM100E Coherent power meter. The laser power was varied by varying the repetition rate of the laser.

Figure 5:
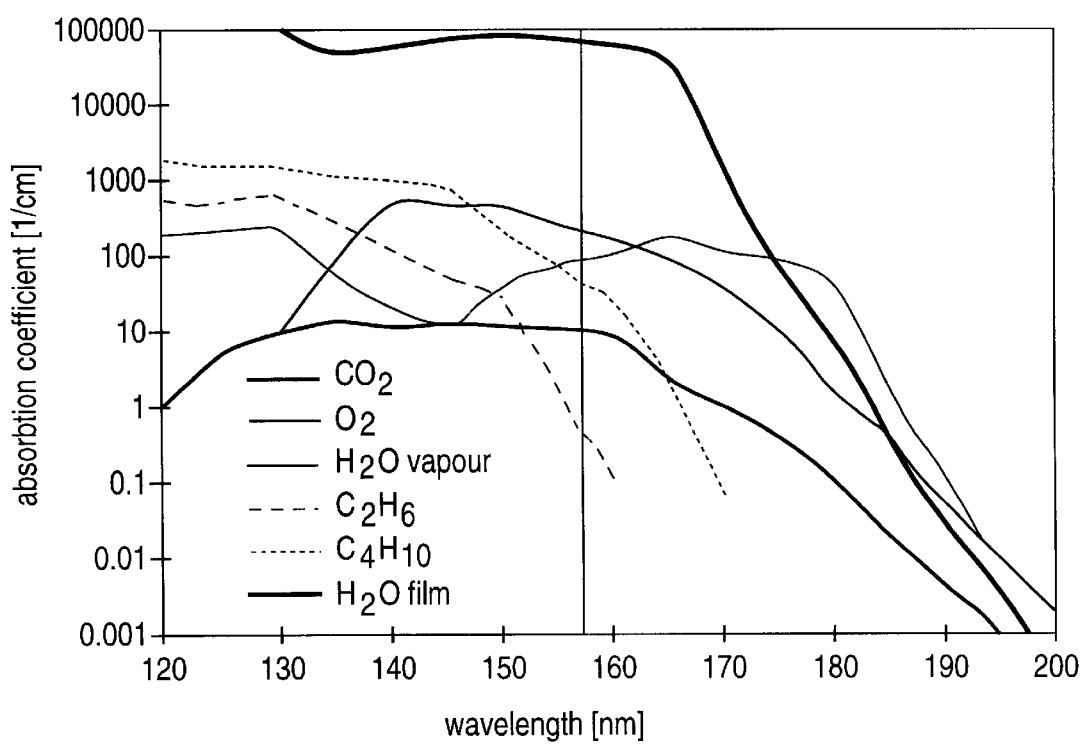
FIG. 5 shows data of spectral absorption data for selected species.

Some background information:

Jenoptik LOS has summarized the absorption cross sections of the various contaminants at 157 nm (see Table 1). Other references review the absorption of these molecules in a wider range of wavelengths (see FIG. 5). The absorption coefficients of $O_2$, water vapor, and $N_2$ are, respectively, 140 cm$^{-1}$, 64 cm$^{-1}$, <0.0002 cm$^{-1}$. The general contamination levels which are in discussion as being desired for the various stages of a lithography system including a VUV or ArF laser in accord with the present invention cover a range between less than 1 ppm and more than 100 ppm (referring to most clean optics regions and open end wafer stages). A purity of the $N_2$ purge gas of a grade 7.0 or even 9.0 is preferred, although grade 5.0 purity $N_2$ gas may be sufficient depending on other system conditions.

Effect of $N_2$ purge gas delivery:

A first identified result of this investigation pursuant to the recognition in the present invention that materials making up the enclosure may effect the contamination level in the enclosure reveals that PTFE tubing is not desirable for use as a material for the enclosure 4. A brief summary follows:

The contamination level of $O_2$ for:
(a) stainless steel tubing was 0.3 ppm (with the VUV laser beam turned off);
(b) purge through copper tube, output of exposure box was 0.5 ppm (with the VUV laser beam turned off);
(c) purge through copper tube, output of exposure box, was 0.8 ppm (with the VUV laser beam turned on)
(d) purge through PTFE-tubes, output of exposure box, 3.5 ppm (with the VUV laser beam turned on)
(e) additional 4 m MFA-gas delivery hose inserted (all other conditions the same) ~8 ppm (with the VUV laser beam turned on).

These findings reveal that the preferred housing 24 is made of stainless steel or copper, and that PTFE and MFA hosing is not desired. The contamination level, and resulting attenuation of the VUV beam, is substantially higher when PTFE hoses are used as opposed to when a stainless steel or copper housing is used. Another material such as glass could be used for achieving low contamination levels comparable with those achieved using copper or stainless, but glass is not preferred for other considerations such as handling practicalities in these systems.

These findings quantitatively confirm another recognition of the present invention that when the VUV laser beam is turned on, the contamination level is higher than when the beam is off. It is recognized in the invention, and the experiments showed, that $H_2O$ vapor/moisture contamination levels were relatively uneffected by the different setups of tubing or housing materials, or by the laser operation conditions, i.e., whether the VUV beam was turned on or off.

Repeatable experiments revealed some interesting observations regarding the following typical behavior with respect to the time constant rate of change of the contamination level after opening the exposure box:

| | $O_2$ | $H_2O$ |
|---|---|---|
| Exposure box closed, 1 pump-flush w/$N_2$ cycle, start | 1.2 ppm | 2.0 ppm |
| Laser on, increase in $O_2$ contamination, after 30 min.: | 2.0 ppm | 1.9 ppm |
| Lasers keeps running continuously, e.g., after 2.5 h: | 1.3 ppm | 1.6 ppm |
| Laser continuously on, after longer time, e.g., 15 h | 0.5 ppm | 0.8 ppm |
| These levels thereafter, e.g., after 2 days: | ~0.4–0.5 ppm | ~0.8–0.9 ppm |

If laser is switched off, but exposure chamber is continued to be purged w/o interrupt, the $O_2$ contamination level drops fast down to, about 0.25–0.30 ppm If after a pause the laser is switched on again, the $O_2$ concentration rises again to about 0.45–0.55 ppm.

Figure 6:
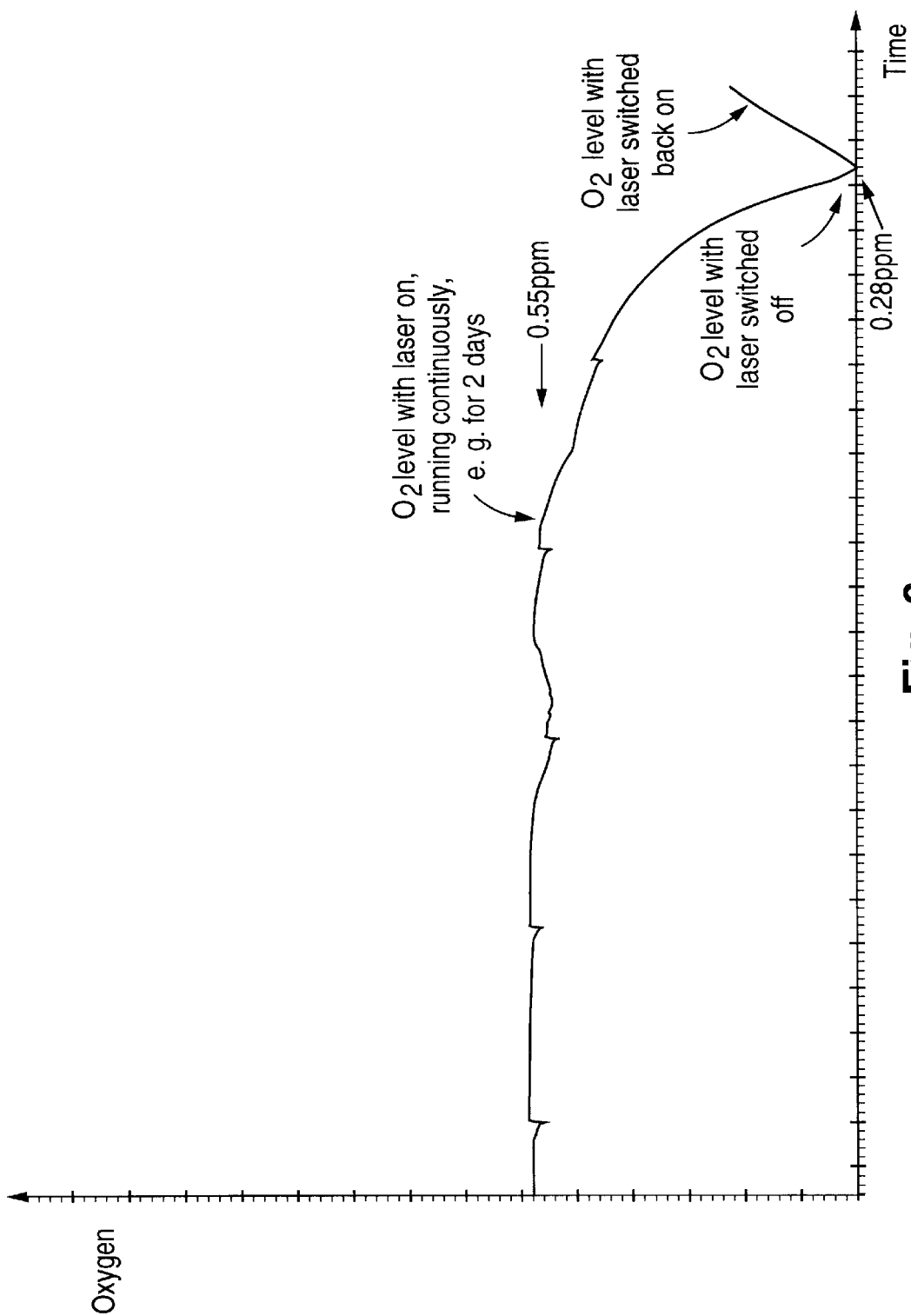
FIG. 6 shows the effect of switching the laser off on the level of $O_2$ along a purged beam path according to the preferred embodiment.
Figure 7:
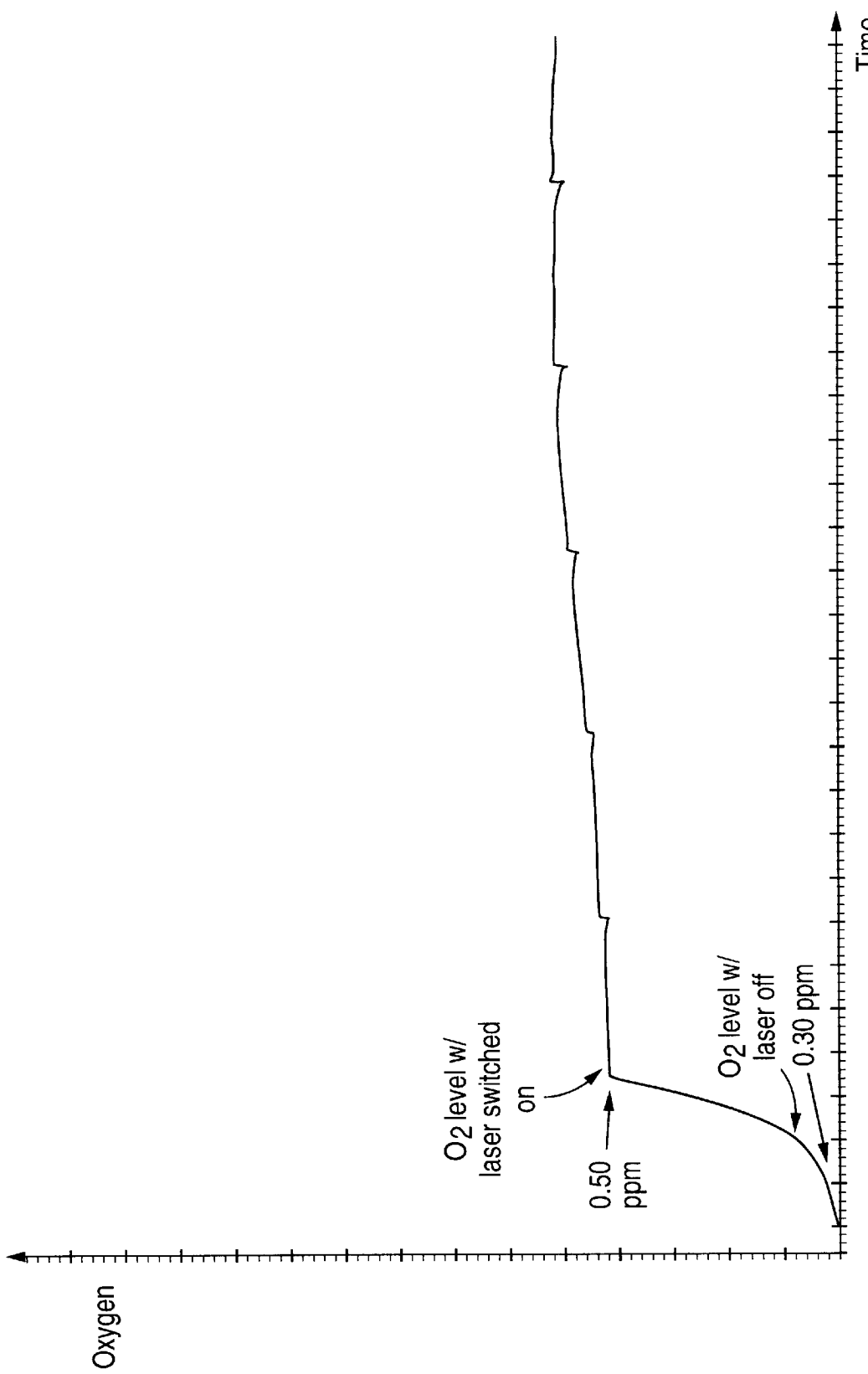
FIG. 7 shows the effect of switching the laser back on on the level of $O_2$ along the purged beam path of the preferred embodiment.

This behavior is illustrated by the experimental results shown at FIGS. 6 and 7.

Figure 8:
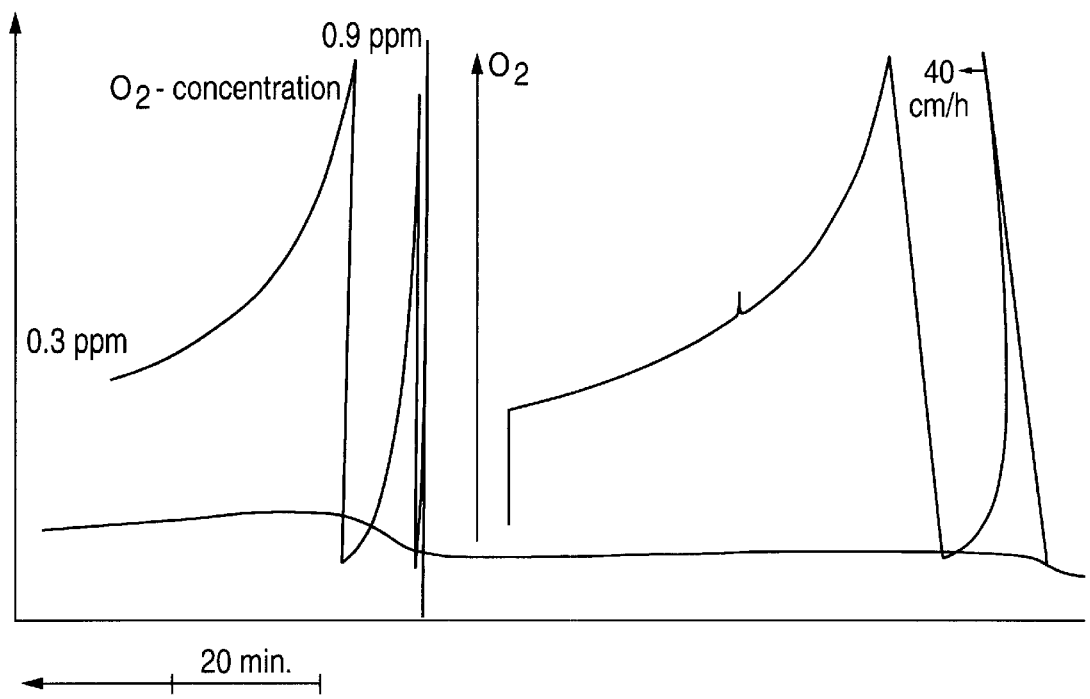
FIG. 8 shows the rate at which an inert gas purged beam path returns to low contamination level after flushing the beam path with $O_2$.
Figure 9:
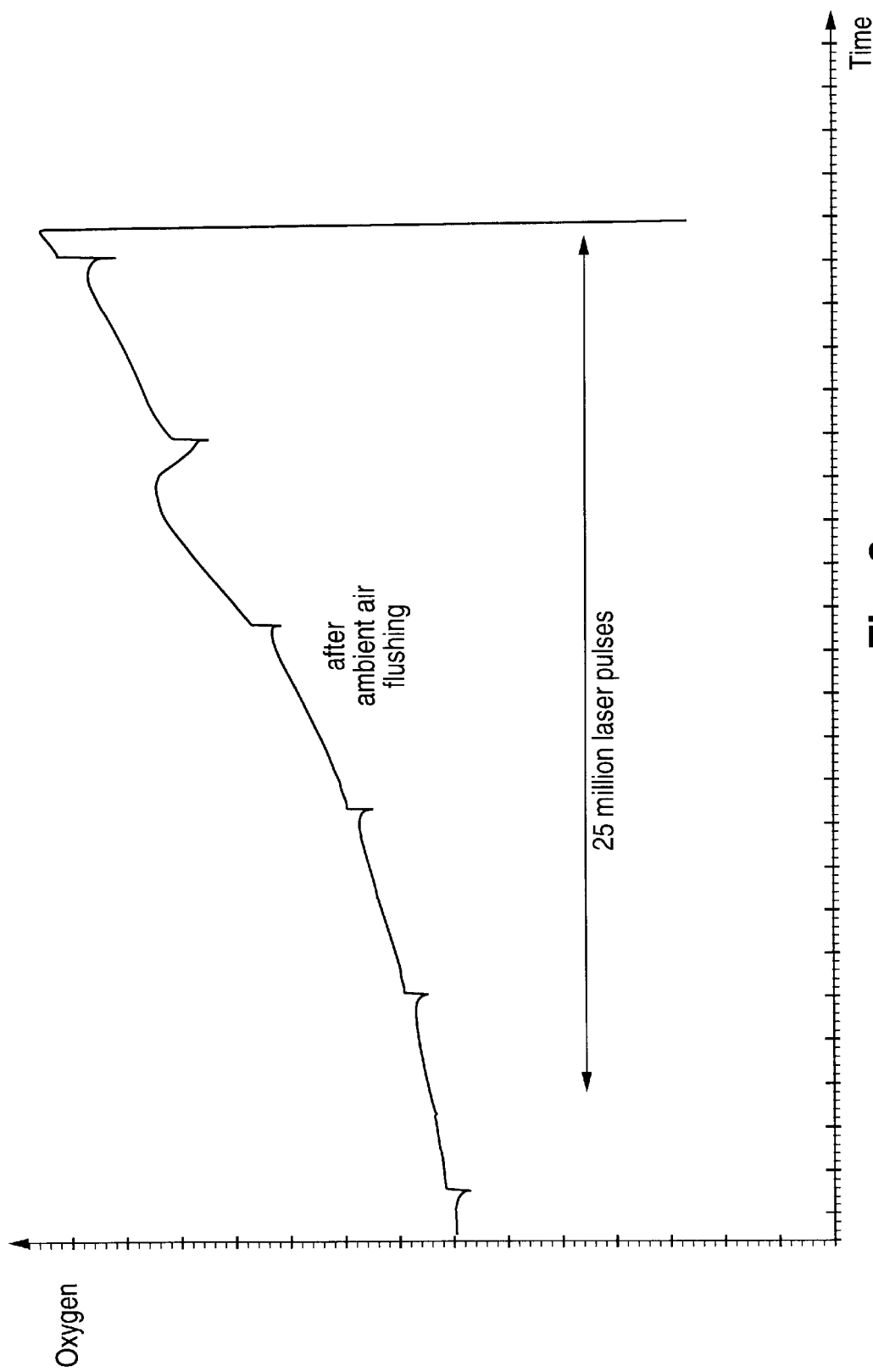
FIG. 9 shows the rate at which an inert gas purged beam path returns to low contamination level after flushing the beam path with ambient air.

Another interesting observation shows the decrease of the $O_2$ level after flushing the exposure box with normal air and with pure $O_2$, both up to normal pressure. The decrease of $O_2$ contamination occurs with two different time constants from the 1 ppm level (1 ppm=full scale of the plotter and v=3 cm/h), as illustrated by the experimental results shown at FIGS. 8 and 9. Thus, after about 4.3 Million laser pulses or shots, as shown in FIG. 8, a constant low $O_2$ level in the case of pure $O_2$ flushing is again achieved. After more than 25 Million pulses, as shown in FIG. 9, the low constant level is achieved when the box is instead flushed with ambient air.

Figure 10:
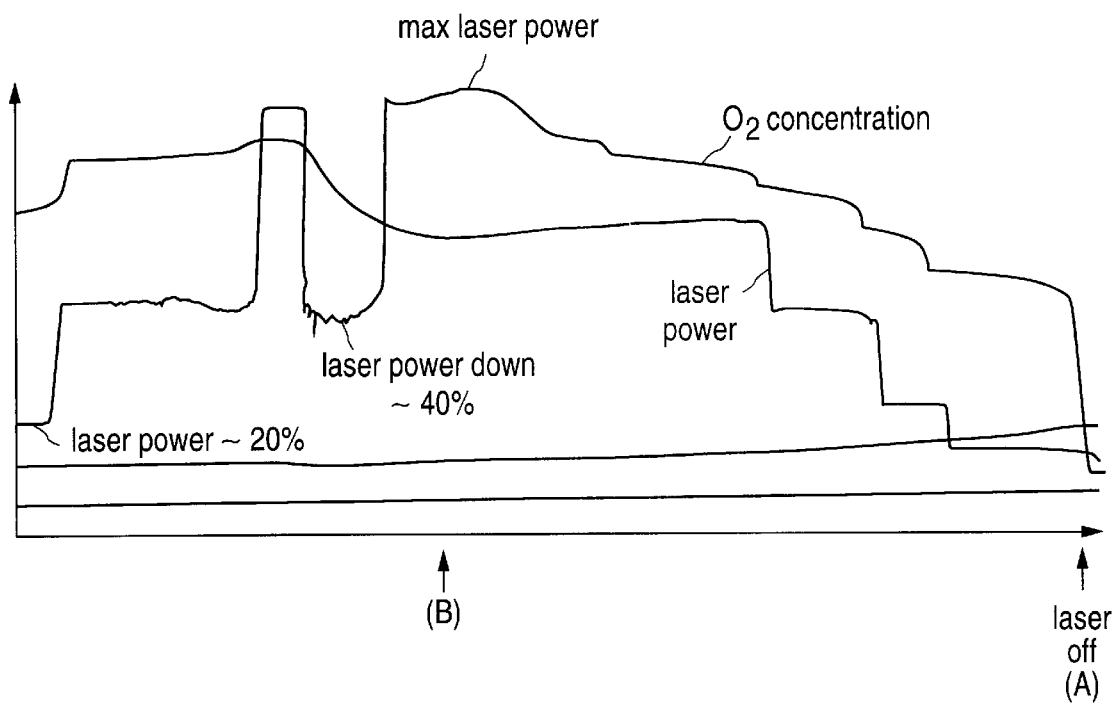
FIG. 10 shows a first pair of overlaying plots of $O_2$ concentration in a purged VUV laser beam path and laser power versus time, illustrating how the $O_2$ concentration depends on the laser power.
Figure 11:
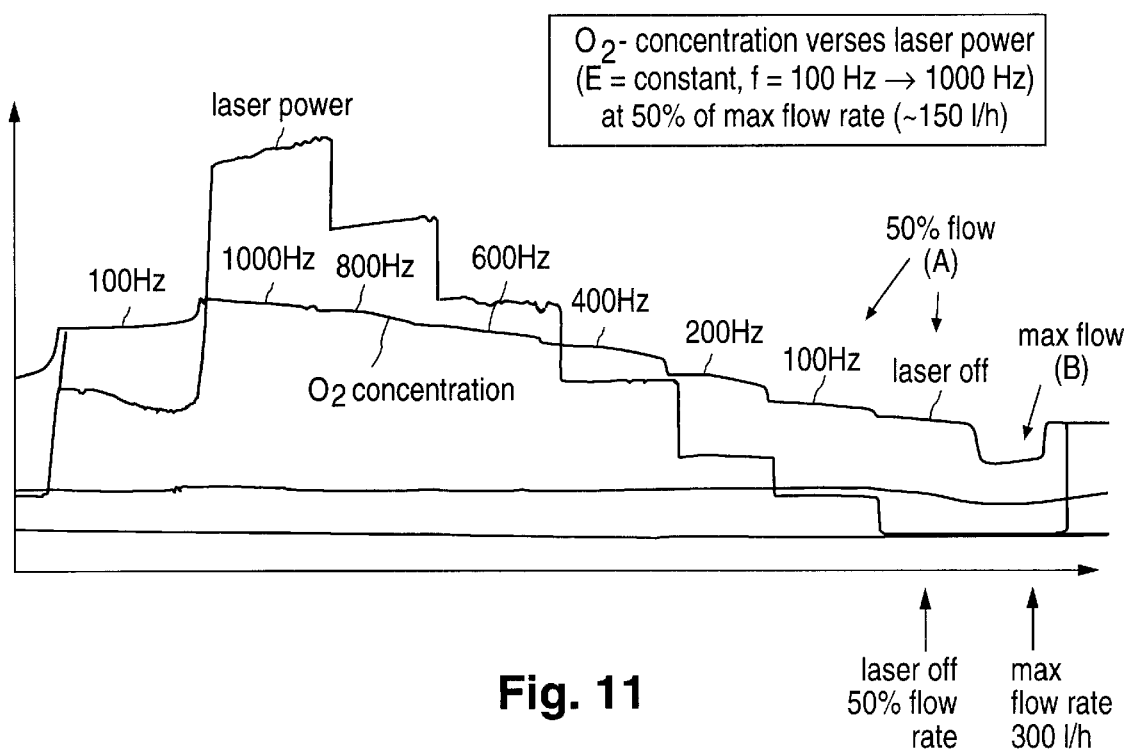
FIG. 11 shows a second pair of overlaying plots of $O_2$ concentration in a purged VUV laser beam path and laser power versus time, illustrating how the $O_2$ concentration depends on the laser power.

FIGS. 10 and 11 each show overlayed plots of $O_2$ concentration within the purged beam path enclosure of the preferred embodiment and laser power as a function of time. Each of FIGS. 10 and 11 illustrate how the $O_2$ concentration depends on the laser power.

The beam path enclosure of FIG. 10 was purged with 99.999% purity $N_2$ gas, or "5 grade" $N_2$ gas. The lowest $O_2$ concentration was observed when the laser was turned off (A). The $O_2$ concentration is shown to increase with increasing laser power from about 0.2 ppm when the laser is turned off to about 0.5 ppm when the laser is at full power (around 10 W).

It is recognized in the present invention that $O_2$ is likely produced by dissociation of residual $H_2O$ content in the non-perfect $N_2$ gas purge. Thus, high purity inert purge gas is preferred. The inert gas may be a noble gas or nitrogen or another gas that does not absorb VUV radiation, and is preferably $N_2$, He, Ne, Kr or Ar. The purity of the inert purge gas is preferably greater than 99.5% purity. Even more preferred is a higher grade purity $N_2$ gas, such as at least 99.9% purity or more. The 5 grade purity nitrogen gas, i.e., 99.999% purity, used in the experiments is an example. In addition, "7 grade" or 99.99999% pure $N_2$ gas may be advantageously used for reducing the $O_2$ concentration in the purged beam path enclosure of the preferred embodiment. Still greater purity inert purge gas such as 9 grade, or 99.9999999% purity gas would result in a lower $O_2$ concentration in the enclosure. These purities may also be used for another inert gas such as He, Ne, Kr or Ar.

The beam path enclosure of FIG. 11 was purged with $N_2$ gas at flow rates of around 150 liters/hour and 300 liters/hour, demonstrating that the $O_2$ concentration reduces with increased $N_2$ flow rate. The laser was operated in energy constant mode and the laser power was varied by varying the repetition rate from 100 Hz to 1000 Hz. The $O_2$ concentration was observed to decrease with decreasing laser power.

Figure 12:
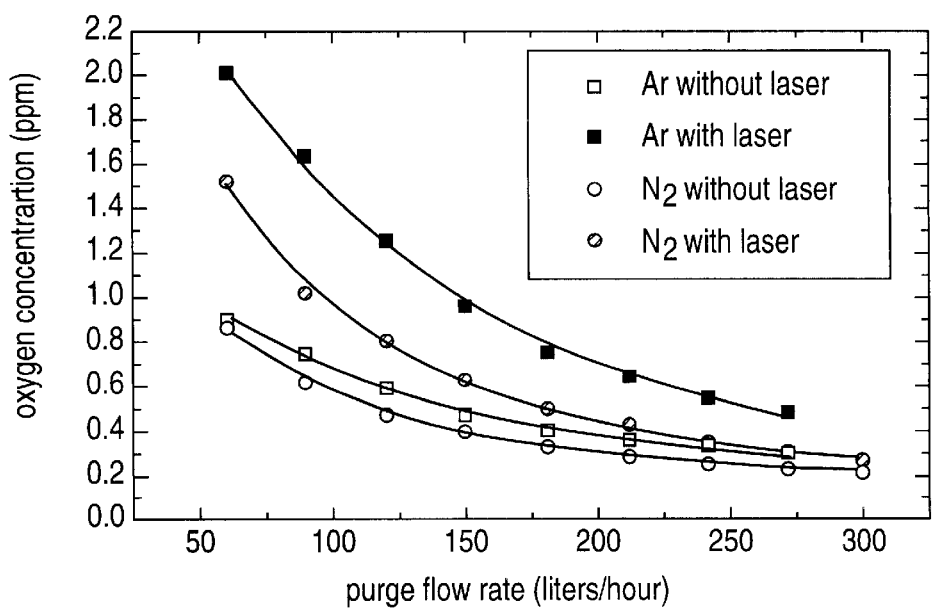
Figure 13:
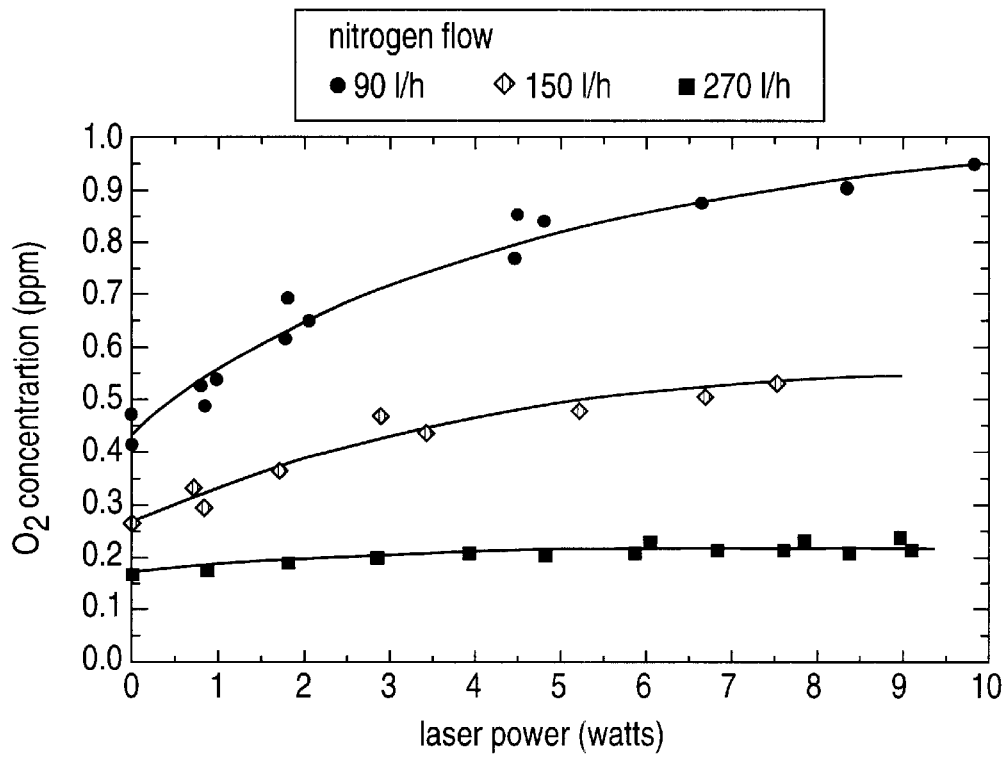
FIG. 13 shows plots of the dependence of oxygen concentration in the enclosure of FIG. 4b on the laser power for nitrogen purge gas at 5.3 W laser power for various purge gas flow rates.
Figure 14:
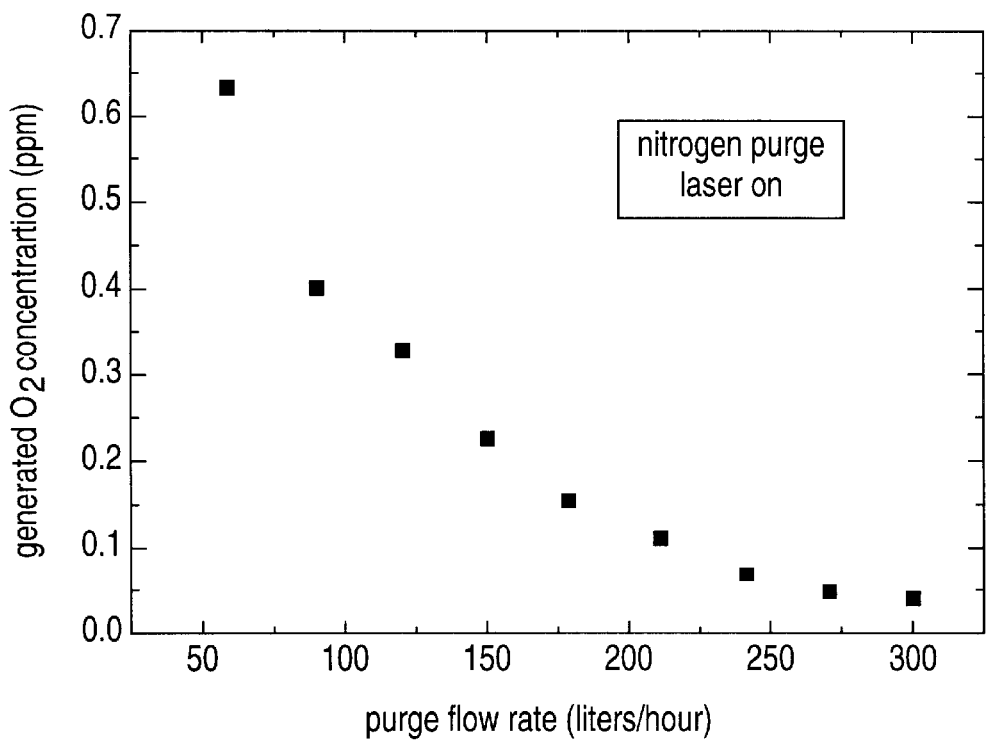

FIGS. 12–14 confirm the recognition in the present invention that the gas flow rate, inert gas used and laser power each affect the concentration of oxygen in the enclosure 24. FIG. 12 shows plots of $O_2$ concentration versus purge flow rate for argon purge gas with the laser on and off, and for nitrogen purge gas with the laser on and off. The experiments showed that the oxygen concentration reduces sharply with flow rate up to around 150 l/h, and decreases more gradually from 150 l/h to 300 l/h for both gases with the laser on or off. The nitrogen purge gas yielded lower oxygen concentrations than the argon purge gas under the same laser operation conditions. The oxygen concentration was greatly reduced when the laser was turned off compared with when the laser was turned on.

FIG. 13 shows the dependence of the oxygen concentration in the enclosure 24 on the laser power at varying nitrogen purge gas flow rates of 90 l/h, 150 l/h and 270 l/h. Higher oxygen concentrations were observed at lower flow rates. Although the oxygen concentration increased with laser power at each flow rate, the oxygen concentration increased more rapidly with laser power at lower flow rate. For example, at 270 l/h, the oxygen concentration is barely observed to increase from 0–10 W laser power, remaining around 0.2 ppm, whereas at 90 l/h, the oxygen concentration increased from around 0.4 ppm to around 1.0 ppm from 0–10 W laser power.

FIG. 14 shows the generated $O_2$ concentration versus nitrogen purge flow rate with the laser turned on and operating at around 5.4 W. The oxygen concentration is observed to decrease substantially asymptotically from around 0.6 ppm at 50 l/h to around 0.05 ppm at 300 l/h, wherein the plot is of the estimated oxygen concentration generated due to the presence of the VUV laser beam in the enclosure, instead of the total $O_2$ concentration.

In brief, a contamination level of less than 1 ppm can be achieved for both $O_2$ and $H_2O$ in a purging enclosure 4 such as that described above wherein the purging gas is 5.0 grade $N_2$. There is no tendency observed of approaching the Zero-light-level, or laser off level, even when the laser is running for several days. The VUV-radiation itself appears to increase the $O_2$ content in the outlet of the enclosure. It may be speculated that the reason for this is one or more of the following:

(a) a cracking of residual $H_2O$ content in the $N_2$ purge gas; and (b) outgassing from mirrors and/or beam splitter surfaces or from the walls of the enclosure 4 (but this should be run in an asymptotic decrease of the $O_2$ content, too).

As described above and at FIGS. 6 and 7, it is observed that there is an increase of the $O_2$ contamination level when the laser radiation is on versus when the laser is turned off.

It is therefore advantageous to have the window 18 shown at FIG. 4 and described above to separate the enclosure 4 of the molecular fluorine laser from the purge volume of external processing equipment and/or the workpiece that the VUV beam is directed to. Otherwise, contamination which arises due to the VUV radiation in the enclosure 4 may contaminate the purge volume of the external equipment or workpiece at an undesirable or intolerable level.

In addition, the experiments showed that higher $O_2$ contamination levels occur when PTFE-hoses are used in the enclosure 4 of the laser purge gas line versus using stainless steel and/or copper for the material of the enclosure. Thus, advantageously, the enclosure of the present invention uses stainless steel and/or copper for the material of the enclosure.

The present invention can be applied as well to an enclosure for a beam line for other radiation below 200 nm, such as is affected by absorption in $O_2$ and $H_2O$. Examples include the 193 nm output emission of the ArF excimer laser, or a frequency multiplied output of a solid state laser or dye laser. That is, a fluctuation in $O_2$ will effect the amount of absorption occurring in a 193 nm beam line, or another sub-200 nm beam line, and so the present invention may be advantageously applied to the ArF laser, or another laser emitting under 200 nm, as well as to the molecular fluorine laser.

The above description is not meant to set forth or limit in any way the scope of the present invention, but only to provide examples of preferred and alternative embodiments. Instead, the scope of the present invention is that set forth in the claims that follow, and structural and functional equivalents thereof.

For example, what is described at any of U.S. Pat. Nos. 6,005,880 and 6,002,697, and U.S. patent applications Ser. Nos. 09/317,695, 09/130,277, 09/172,805, 09/379,034, 09/244,554, 09/317,527, 09/327,526, 09/447,882, No. 60/162,845, Ser. No. 09/453,670, Nos. 60/122,145, 60/140, 531, 60/166,952, 60/173,993, 60/166,277 and 60/140,530, each of which is assigned to the same assignee and is hereby incorporated by reference, may be practiced in combination with what is described above and below.

What is claimed is:

1. A system for delivering a beam having a wavelength of less than 200 nm to an external housing leading ultimately to a workpiece, comprising:

a system for generating said beam having said wavelength of less than 200 nm;

an enclosure separating at least a portion of the beam path exiting the beam generating system from the outer atmosphere; and one or more ports for evacuating the enclosure and removing VUV photoabsorbing species therefrom and maintaining said beam path substantially free of VUV photoabsorbing species to enable the beam to propagate along said beam path, such that the energy of the beam can substantially traverse said enclosure along said beam path, and wherein said enclosure contains no more than 0.5 ppm $O_2$.

2. The system of claim 1, wherein the window comprises a material selected from the group of materials consisting of $CaF_2$, $BaF_2$, $SrF_2$, $MgF_2$, LiF, quartz and fluorine-doped quartz.

3. The system of claim 1, wherein the window comprises $CaF_2$.

4. The system of claim 1, wherein said window is disposed between said enclosure and an external housing of an optical imaging apparatus of a photolithography system.

5. The system of claim 1, in which the laser beam is provided by a laser selected from the group consisting of an $F_2$ laser and an ArF laser.

6. The system of claim 1, further comprising a window sealing said enclosure that is substantially transparent at said wavelength less than 200 nm to allow the beam to exit the enclosure and enter said housing, while preventing contaminants generated within the enclosure from exiting the enclosure and contaminating surfaces within said housing.

7. The system of any of claims 1 or 6, wherein said enclosure substantially comprises one or more materials selected from the group of materials consisting of stainless steel and copper.

8. The system of any of claims 1 or 6, wherein said enclosure is sealably coupled to said laser.

9. The system of claim 6, in which the laser beam is provided by a laser selected from the group consisting of an $F_2$ laser and an ArF laser.

10. A system for delivering a beam having a wavelength less than 200 nm ultimately to a workpiece, comprising:

a system for generating said beam having said wavelength of less than 200 nm;

an enclosure separating at least a portion of the beam path exiting the beam generating system from the outer atmosphere;

a plurality of ports for flowing an inert gas of greater than 99.5% purity within said enclosure to enable the beam to propagate along said beam path, such that the energy of the beam at less than 200 nm can traverse said enclosure without substantial attenuation due to the presence of VUV photoabsorbing species along said beam path, and wherein said enclosure contains no more than 0.5 ppm $O_2$.

11. The system of claim 10, further comprising a window sealing said enclosure that is substantially transparent at said emission wavelength less than 200 nm to allow the beam to exit the enclosure and enter said housing, while preventing contaminants generated within the enclosure from exiting the enclosure and contaminating surfaces within said housing.

12. The system of claim 10, wherein the purity of said inert gas is at least 99.9%.

13. The system of claim 12, wherein said inert gas is selected from the group of gases including nitrogen, argon, neon, krypton and helium.

14. The system of claim 12, wherein said inert gas comprises a gas selected from the group of gases consisting of argon and nitrogen.

15. The system of claim 10, wherein the purity of said inert gas is at least 99.999%.

16. The system of claim 10, wherein the purity of said inert gas is at least 99.99999%.

17. The system of claim 10, in which the laser beam is provided by a laser selected from the group of lasers consisting of an ArF laser and an $F_2$ laser.

18. The system of claim 10, wherein said inert gas is flowed at a flow rate of at least 150 liters per hour.

19. The system of claim 10, wherein said plurality of ports includes a port for evacuating said enclosure prior to flowing said inert gas therethrough, and wherein said inert gas is flowed at a flow rate of less than substantially 0.2 liters per minute.

20. The system of claim 19, wherein said enclosure is maintained at an overpressure of less than substantially 50 mbar.

21. The system of claim 10, wherein said enclosure substantially comprises one or more materials selected from the group of materials consisting of stainless steel and copper.

22. The system of claim 10, wherein said enclosure is sealably coupled to said laser.

23. The system of claim 10, wherein said plurality of ports includes a port for evacuating said enclosure.

* * * * *